(12) United States Patent
Vincent et al.

(10) Patent No.: US 7,989,327 B2
(45) Date of Patent: Aug. 2, 2011

(54) MANUFACTURING METHOD FOR A SEMI-CONDUCTOR ON INSULATOR SUBSTRATE COMPRISING A LOCALISED GE ENRICHED STEP

(75) Inventors: Benjamin Vincent, Ixelles (BE); Laurent Clavelier, Grenoble (FR); Jean-Francois Damlencourt, Laval (FR)

(73) Assignee: Commissariat a l'Energie Atomique, Paris (FR)

( * ) Notice: Subject to any disclaimer, the term of this patent is extended or adjusted under 35 U.S.C. 154(b) by 247 days.

(21) Appl. No.: 12/340,839

(22) Filed: Dec. 22, 2008

(65) Prior Publication Data
US 2009/0170295 A1    Jul. 2, 2009

(30) Foreign Application Priority Data
Dec. 27, 2007  (FR) ..................... 07 60380

(51) Int. Cl.
*H01L 21/20* (2006.01)
(52) U.S. Cl. .............. 438/507; 257/E21.561
(58) Field of Classification Search .......... 438/507; 257/E21.233, E21.561
See application file for complete search history.

(56) References Cited

U.S. PATENT DOCUMENTS

| | | | |
|---|---|---|---|
| 6,180,499 B1 | 1/2001 | Yu | |
| 6,727,550 B2 * | 4/2004 | Tezuka et al. | 257/347 |
| 6,916,727 B2 * | 7/2005 | Leitz et al. | 438/478 |
| 7,084,050 B2 * | 8/2006 | Bedell et al. | 438/480 |
| 2003/0013305 A1 | 1/2003 | Sugii et al. | |
| 2005/0245092 A1 | 11/2005 | Orlowski et al. | |
| 2006/0063358 A1 | 3/2006 | Bedell et al. | |
| 2007/0284625 A1 | 12/2007 | Damlencourt et al. | |

FOREIGN PATENT DOCUMENTS

EP    1 868 232 A    12/2007

OTHER PUBLICATIONS

Tezuka et al., "Dislocation-free formation of relaxed SiGe-on-insulator layers", Applied Physics Letters, vol. 80, No. May 13, 2002.
Tezuka et al., "A Novel Fabrication Technique of Ultrathin and Relaxed SiGe Buffer Layers with High Ge Fraction for Sub-100nm Strained Silicon-on-Insulator MOSFETs", Jpn J. Appin. Phys. vol. 40 (2001) pp. 2866-2874.
French Search Report, (Aug. 2008).

* cited by examiner

*Primary Examiner* — Chandra Chaudhari
(74) *Attorney, Agent, or Firm* — Pearne & Gordon LLP

(57) ABSTRACT

A method of manufacturing a semi-conductor on insulator substrate from an SOI substrate, wherein a $Si_{1-x}Ge_x$ layer is formed on a superficial layer of silicon having a buried electrical insulating layer. A silicon oxide layer is formed on the $Si_{1-x}Ge_x$ layer. The resulting stack of silicon, $Si_{1-x}Ge_x$ and silicon oxide layers is etched up to the buried insulating layer leaving an island of the stack, or up to the superficial layer leaving a zone of silicon and an island of the stack. A mask is formed to protect against oxidation on the etched structure, wherein the protective mask only leaves visible the silicon oxide layer of the island. The germanium of the $Si_{1-x}Ge_x$ layer is condensed on the island to obtain an island comprising a layer that is enriched in germanium, or even a layer of germanium, on the insulating layer, with a silicon oxide layer on top of it.

13 Claims, 5 Drawing Sheets

MANUFACTURING METHOD FOR A SEMI-CONDUCTOR ON INSULATOR SUBSTRATE COMPRISING A LOCALISED GE ENRICHED STEP

TECHNICAL FIELD

The invention refers to a manufacturing method for a semi-conductor on insulator substrate comprising a localised Ge enriched step.

To date, microelectronic technologies have mainly been based on the use of silicon. This material is now reaching its limits of use for continued reduction of MOSFET devices.

In the manufacture of increasingly rapid devices, it is strongly envisaged to substitute silicon by a semi-conductor material with better carrier mobilities. Germanium theoretically satisfies this criterion to increase the mobility of both the holes and electrons.

From an experimental point of view, Germanium seems particularly suited for high performance pMOSFETs (conduction via the holes). Its advantage as a substrate for nMOSFETs (conduction via the electrons) has however not yet been proven experimentally and is the subject of debate at present. In the manufacture of high performance CMOS technologies ("Complementary Metal Oxide Semiconductor"), a co-integration of silicon and germanium substrates is therefore strongly envisaged in the search for innovative substrates for microelectronics. This allows the co-integration of nMOSFETs on silicon with pMOSFETs on germanium.

Ti increase the electrical performances of the transistors even further, an Silicon-Germanium on insulator co-integration is also envisaged. The nMOSFET is therefore on an SOI substrate (Silicon On Insulator) and the pMOSFET on a GeOI substrate ("Germanium On Insulator"). The insulator layer on which the silicon and germanium materials are positioned permits a reduction in the leak currents of the respective substrates and thus the optimisation of the electrical performances of the two types of transistors: n and p.

STATE OF THE PRIOR ART

Different Germanium on insulator or Silicon-Germanium on insulator (SGOI) substrate manufacturing techniques are proposed in the prior art: the SMART CUT™ method, the RMG ("Rapid Melt Growth") technique, and the "germanium enriched" method. In the literature consecrated to this, this method is sometimes called "germanium condensation".

This last technique permits either to manufacture full plate Germanium-on-Insulator substrate, or to manufacture localised Germanium on insulator structures. It moreover permits the creation of Silicon-Germanium on insulator (SGOI) structures. The method is based on the selective oxidation of the silicon with respect to the germanium in a dry atmosphere at high temperature, and on the total miscibility of the germanium and the silicon in a silicon-germanium alloy regardless of the concentration of germanium in this alloy (see T. TEZUKA et al., Jpn. J. Appl. Phys., Vol. 40 (2001), pages 2866 to 2874).

The first step of the method consists in the epitaxy of a layer of SiGe on an Silicon-on-Insulator substrate. The concentration and the thickness of the layer of epitactic SiGe are preferably selected so that the layer of SiGe is in a state of pseudo-morphous strain. The second step is dry oxidation at high temperature (above 90° C.) permitting the exclusive formation of the $SiO_2$ oxide due to a higher formation (negative) enthalpy than that of the $GeO_2$. During oxidation, the germanium is trapped between two barriers: the interface with the fixed buried oxide (BOX), and the moving oxidation interface. Due to the high oxidation temperature, the germanium diffuses into the layer of SiGe defined by these two barriers, thus making the SiGe alloy homogeneous. As the thickness of the SiGe reduces, the concentration in germanium is enriched during the oxidation, thus forming an SGOI substrate. The concentration of Ge may reach 100% using this technique to form a pure GeOI substrate with a suitable oxidation time.

FIGS. 1A to 1D illustrate this method. FIG. 1A shows a silicon substrate 1 supporting a layer of buried oxide 2 BOX and a thin layer of electronic quality silicon 3. A layer 4 of SiGe has been deposited by epitaxy on the thin layer 3. A silicon oxide layer 5 is then formed by dry oxidation at high temperature on the layer of SiGe 4 (see FIG. 1B). The germanium of the SiGe alloy then condenses on the layer of buried oxide 2. The structure shown in FIG. 1C is thus obtained which comprises a layer of germanium 6 on the layer of buried oxide 2 which supports a silicon oxide layer 5. The layer of oxide 5 may therefore be eliminated to reveal the layer of germanium 6. This is what is shown in FIG. 1D.

The enrichment method is the only GeOI or SGOI substrate manufacturing method in which planar co-integration of SOI and GeOI, or SGOI structures, may be obtained. This may be carried out using two approaches.

A first approach consists of carrying out localised oxidation. The local enriched zones are defined by the openings on a protective mask on the oxidation previously deposited on the SiGe on SOI structure.

A second approach consists of oxidation of local island type structures of SiGe on SOI, etched after epitaxy of the layer of SiGe on an SOI substrate. This approach is described in the document "Dislocation-free formation of relaxed SiGe on insulator layers" by T. TEZUKA et al., Appl. Phys. Lett., Vol. 80, n° 19, 13 May 2002, pages 3560 to 3562.

For this second approach, two problems have been experimentally highlighted. They are illustrated by FIG. 2. A first problem results from the lateral reduction of the patterns due to their lateral oxidation. This reduction of the patterns further causes different enrichments in germanium according to their initial sizes: the small patterns in fact enrich more quickly than the larger ones. A second problem results from the oxidation of the Si substrate through the buried oxide outside of the active zones. This problem is even more critical for fine buried oxides. It has an influence on a local deformation of buried oxide causing a deformation (raising) of the layer of condensed germanium on the edge of the active zone.

Faced with the first problem (lateral oxidation), the manufacture of spacers (from a material that is impermeable to oxygen such as silicon nitride) on either side of the SiGe/Si active zones proposed by IBM (see U.S. Pat. No. 7,067,400), may be a solution.

FIG. 3 shows the enrichment of such structures, islands of SiGe/Si with spacers. The spacers prevent the lateral oxidation of the structure, but do not prevent the deformation of the layers due to the oxidation through the buried oxide outside of these active zones. Indeed in FIG. 3, swelling of the buried oxide of 80 nm may be observed, thus deforming the end of the layer of condensed SiGe close to the spacers.

In the prior art, this second problem is not resolved. This problem is however very critical for a localised enrichment method as it has an influence on the planarity of the structures. FIG. 4 shows an SEM characterisation (scanning electron microscope) carried out on two neighbouring islands after condensation. The swelling of the buried oxide between these two islands clearly shows that there is a loss of planarity on the final structure, which is critical for the following steps for manufacturing transistors.

The document U.S. 2003/013 305 A1 discloses a method for obtaining SiGe on insulator layers. On an SOI substrate featuring a buried silicon oxide layer, on the superficial layer of silicon are successively deposited: a layer of SiGe, a layer of silicon, a silicon oxide layer, a layer of polycrystalline silicon and a silicon oxide layer. The layer of SiGe is therefore between two layers of silicon. Trenches are then formed in the stack, up to the layer of buried oxide, to insulate the islands. A silicon oxide layer is then formed to encapsulate each island. The purpose of this silicon oxide layer is to protect the structure of the islands during a subsequent high temperature heat treatment to avoid the islands being transformed into balls. During the heat treatment, the germanium of the SiGe layer diffuses into the neighbouring layers of silicon, which causes a single layer of SiGe to be formed. This method does not permit a layer of pure germanium on insulator to be obtained.

DESCRIPTION OF THE INVENTION

The proposed invention permits localised zones of GeOI and SGOI to be created by oxidation of local zones of epitactic SiGe on SOI without a reduction in size of these zones and without deformation of the layers of the stack (buried oxide or layer of germanium), thus ensuring that the planarity of the layer is maintained.

The invention consists of a method of enriching localised epitactic SiGe on SOI structures surrounded by an oxidation mask. This mask protects both the enrichment zones from lateral oxidation and the buried oxide outside of the enrichment zones from oxidising (preferably this mask is made of silicon nitride).

The initial structure prior to enrichment preferably uses a layer of oxide on the initial layer of SiGe to avoid any formation of germanium sub-oxides during the rise in temperature up to the enrichment temperature.

The purpose of the invention is therefore a manufacturing method of a semi-conductor on insulator substrate from an SOI substrate featuring a superficial layer of silicon on an electrically insulating layer, called buried insulating layer, wherein a layer of $Si_{1-x}Ge_x$ is formed on the superficial layer of silicon, and wherein the method comprises the following steps:
  formation of a silicon oxide layer on the layer of $Si_{1-x}Ge_x$,
  etching of the stack formed by the superficial layer of silicon, the layer of $Si_{1-x}Ge_x$ and the silicon oxide layer, wherein the etching is carried out either up to the buried insulating layer to obtain an etched structure with at least one island of said stack, or up to the superficial layer of silicon to obtain an etched structure with at least one zone of silicon and at least one island of said stack,
  formation of a mask to protect against oxidation on the etched structure, wherein the protective mask only leaves visible the silicon oxide layer of the island,
  condensation of the germanium of the layer of $Si_{1-x}Ge_x$ on the island to obtain an island comprising a layer that is enriched in germanium, or even a layer of germanium, on the buried insulating layer, with a silicon oxide layer on top of it.

According to one specific embodiment, the formation of the mask to protect against oxidation comprises:
  the deposit of a layer which protects against oxidation on the etched structure, wherein the layer which protects against oxidation is thicker than the combined thickness of the superficial layer of silicon and the layer of $Si_{1-x}Ge_x$ and thinner than the thickness of the stack,
  the planarisation of the layer which protects against oxidation until the silicon oxide layer of the island is revealed.

In this specific embodiment, the method may further comprise, following the deposition of the layer which protects against oxidation, the deposition of a covering layer on the layer which protects against oxidation, wherein the planarisation step comprises the chemical-mechanical polishing of the covering layer stopping on the part of the layer which protects against oxidation located on the island, then the simultaneous etching of the layer which protects against oxidation and the covering layer which stops on the layer which protects against oxidation until said mask is obtained.

The method may further comprise, after the germanium condensation step, a step for eliminating the mask to protect against oxidation and the silicon oxide layer on top of the germanium enriched layer.

The method according to this invention permits at least one island (or mesa) to be obtained comprising a layer of silicon-germanium, or even a layer of germanium on the electrically insulating layer of the substrate. It also permits silicon and silicon-germanium (or simply germanium) on insulator co-integration.

According to one specific embodiment, the germanium condensation step comprises a repetition of oxidation and de-oxidation steps. This repetition of oxidation and de-oxidation steps may be carried out so that said silicon oxide layer on top of said germanium enriched layer does not overshoot the mask to protect against oxidation. The mask to protect against oxidation may possibly be formed in a state of tension or compression strain.

BRIEF DESCRIPTION OF THE DRAWINGS

The invention will be more clearly understood and other advantages and specific features will be observed upon reading the following description, provided by way of non-restrictive example, accompanied by appended drawings among which.

DETAILED DESCRIPTION OF EMBODIMENTS OF THE INVENTION

The manufacturing method is based on an SOI substrate formed by a silicon support which supports a silicon oxide layer, or buried oxide layer, and a superficial layer of silicon. The initial substrate may also be an sSOI ("strained SOI") substrate. It may even be an XsSOI ("extreme strained SOI") substrate. These substrates are advantageous to permit a strained in tension SOI/GeOI (or SGOI) strained in compression co-integration after enrichment. On the superficial layer of silicon, a layer of mono-crystalline SiGe (or $Si_{1-x}Ge_x$) is formed by epitaxy. The concentration and the thickness of the layer of SiGe are preferably chosen so that the layer of SiGe is in a state of pseudo-morphous strain. On the layer of raw SiGe, a silicon oxide layer is deposited. This oxide is preferably a high temperature thermal oxide or HTO ("High Thermal Oxide").

According to a first variant of embodiment of the invention, islands (or mesa) are etched wherein the etching is stopped on the layer of buried oxide. Each island thus comprises, on the layer of buried oxide, part of the superficial layer of silicon supporting part of the epitactic layer of SiGe and part of the silicon oxide layer.

Next, on the structure obtained, a layer which protects against oxidation is deposited. This protective layer is preferably of the nitride type (SiN or $Si_3N_4$) and is deposited by a PECVD or LPCVD technique or another CVD technique whose temperature is compatible with the underlying stack. The protective layer matches the form of the etched structure.

On the protective layer, an upper silicon oxide layer is deposited. Preferably, this oxide is of the HDP ("High Density Plasma") type. The new protective layer matches the form of the structure previously obtained.

Next chemical-mechanical polishing (CMP) of the upper silicon oxide layer is carried out which stops on the layer which protects against oxidation.

Then common etching is carried out on the prominent part of the layer which protects against oxidation and on the material of the upper silicon oxide layer with chemical etching of the same speed for the material of the layer which protects against oxidation and for the material of the upper silicon oxide layer. This common etching is carried out until it is stopped on the part of the protective layer on top of the buried oxide layer to form the mask which protects against oxidation.

Figure 1A:
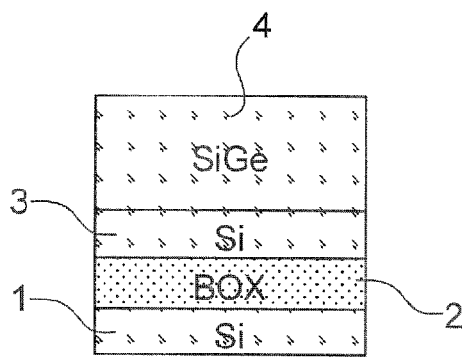
FIGS. 1A to 1D, already described, illustrate the "germanium enriched" method, according to the prior art.
Figure 1B:
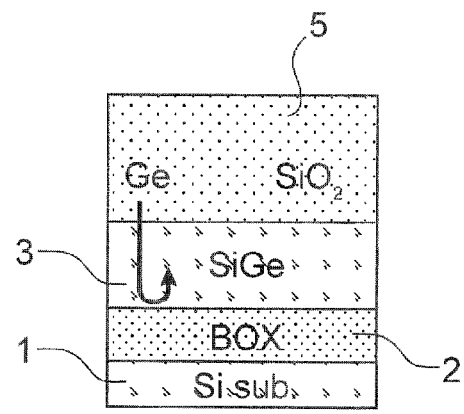
Figure 1C:
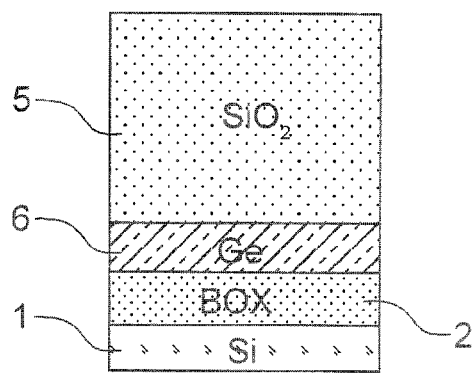
Figure 1D:
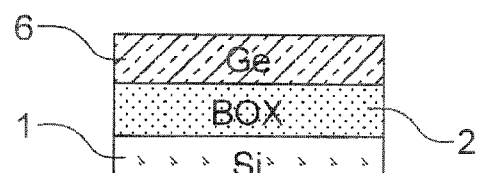
Figure 2:
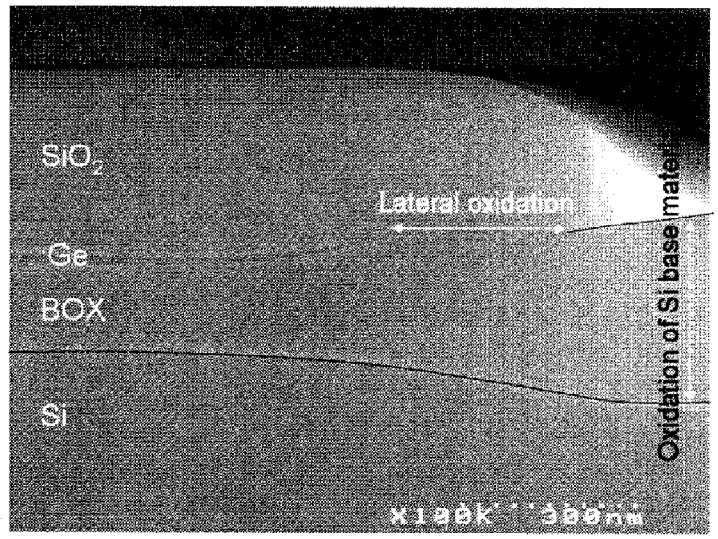
FIG. 2 is a partial cross-sectional view of an SOI substrate on which, in compliance with the prior art, an oxidation of local island type structures of etched SiGe following epitaxy of a layer of SiGe.
Figure 3:
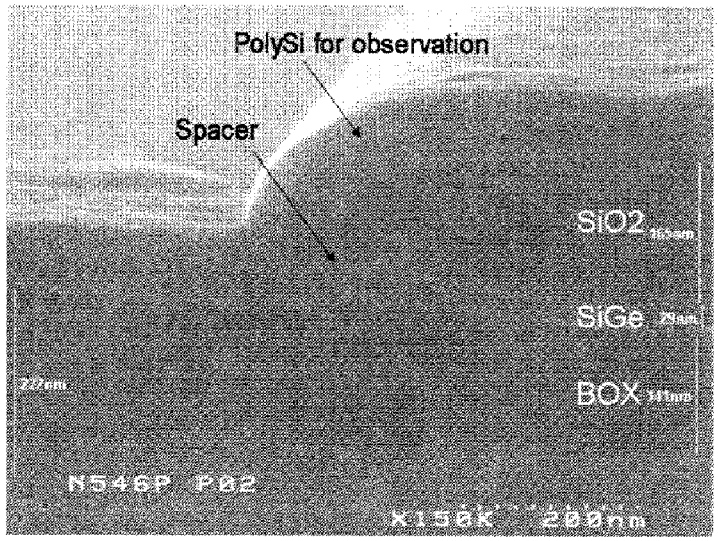
FIG. 3 is a partial cross-sectional view of an SOI substrate on which, in compliance with the prior art, an oxidation of local island type structures of SiGe, as for FIG. 2, but with spacers.
Figure 4:
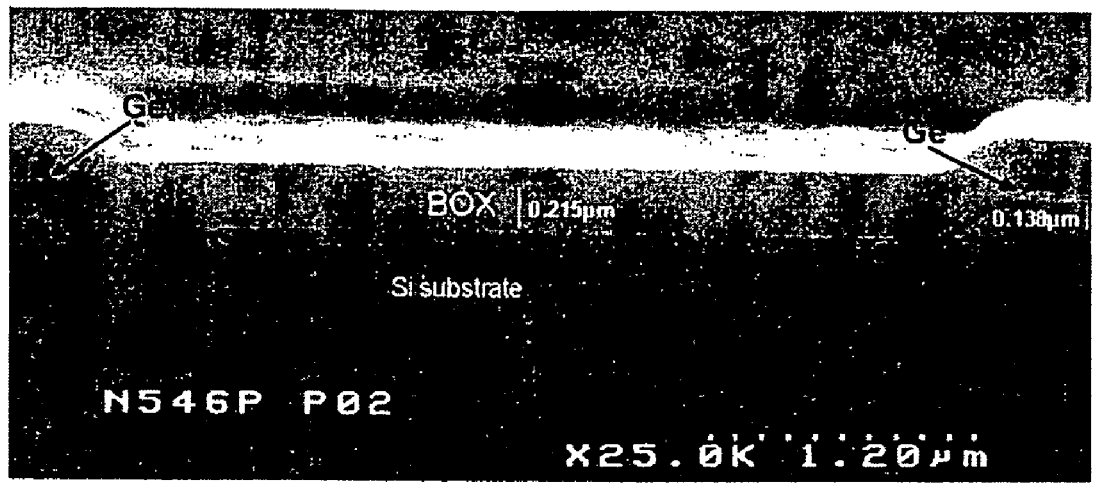
FIG. 4 shows a SEM (scanning electron microscope) characterisation carried out on two neighbouring islands after germanium enrichment, for a structure of the prior art.
Figure 5A:
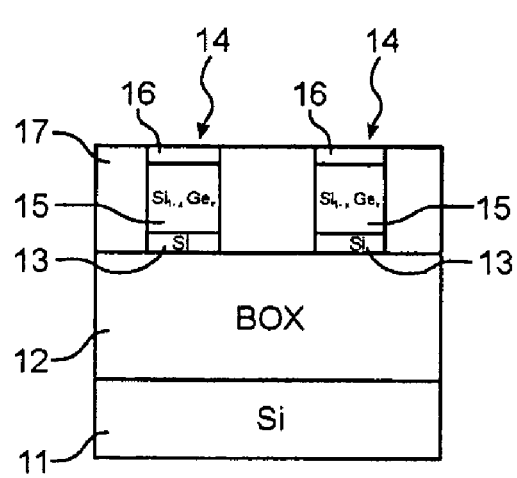
FIGS. 5A and 5B illustrate the principle of the manufacturing method according to the invention, with a mask to protect against lateral oxidation and oxidation through the buried insulating layer, according to a first variant of embodiment.

The structure obtained is shown in FIG. 5A. This figure shows the silicon support 11, the layer of buried oxide 12 and the remaining parts 13 of the superficial layer of silicon of the SOI substrate. Reference 14 designates the islands (or mesas) comprising, superposed, the remaining parts 13 in silicon, the remaining parts 15 in SiGe and the remaining parts 16 in silicon oxide. Reference 17 designates the mask which protects against oxidation surrounding the islands 14 of which only the silicon oxide layer 16 is on the surface.

Figure 5B:
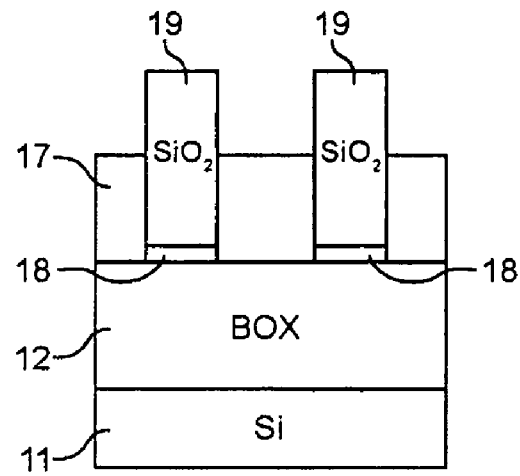

The enrichment in germanium on the localised zones defined by the islands is then carried out, by dry oxidation at high temperature. As shown in FIG. 5B, a transformation of the islands is obtained with germanium enrichment on the remaining parts of the surface silicon, providing, per island, a layer of SiGe 18 on top of the layer of buried oxide 12. The enrichment may be such that the layer 18 is entirely formed of germanium. The rest of the islands is formed by silicon oxide 19. By eliminating the silicon oxide 19 and the mask 17, an SiGe on insulator structure is obtained, or even a germanium on insulator structure.

FIGS. 6A to 6G illustrate, in more detail, different steps of the method according to the invention, according to this specific embodiment.

Figure 6A:
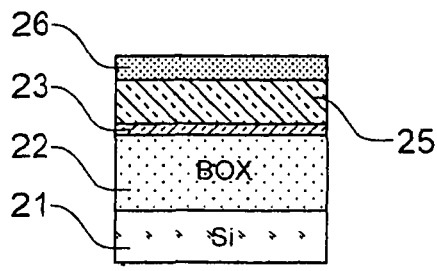
FIGS. 6A to 6G illustrate different steps of the method according to the invention, according to a specific embodiment.

FIG. 6A shows an SOI substrate composed of a silicon support 21 supporting a silicon oxide layer 22 and a superficial layer of silicon 23. The superficial layer of silicon 23 successively supports a epitaxied layer 25 of $Si_{1-x}Ge_x$ and a layer 26 of silicon oxide. In this embodiment, the oxide layer 26 is thicker than the difference between the thickness of the protective mask to be deposited (reference 27 in FIG. 6C) and the thickness of the bi-layer formed by the superposed layer of silicon 23 and the epitaxied layer 25. The thickness of the protective mask 27 is greater than that of the bi-layer.

Figure 6B:
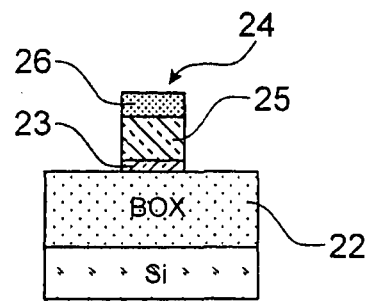

FIG. 6B shows the islands 24 (or mesas) obtained after etching of the stacked layers 23, 25 and 26.

Figure 6C:
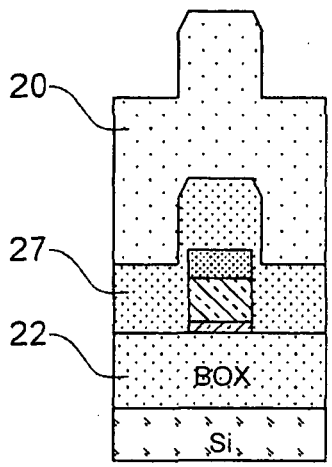

FIG. 6C shows the structure obtained after the deposition of the layer which protects against oxidation 27 followed by the deposition of an upper silicon oxide layer 20. For this layer 20, a thickness at least 2 to 3 times greater than that of the protective layer 27 is selected, to make suitable polishing possible.

By way of example, the layer of epitaxied SiGe has a thickness of 75 nm and an atomic concentration in Ge of 10% and the superficial layer of silicon of the SOI substrate has a thickness of 20 nm. In this case, a layer of oxide 26 that is 40 nm thick, a protective mask 27 that is 120 nm thick and a layer of oxide 20 that is 300 nm thick are selected.

Figure 6D:
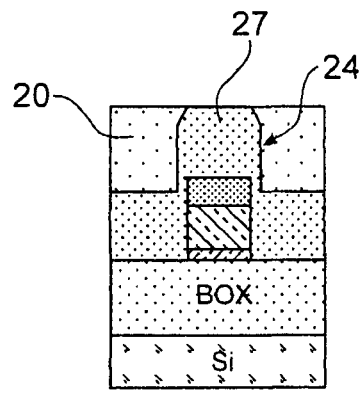

Next a chemical-mechanical polishing (CMP) step on the upper layer of oxide 20 is carried out, stopping on the upper part of the layer which protects against oxidation 27. This is shown by FIG. 6D.

Figure 6E:
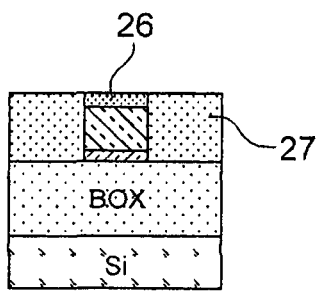

Next simultaneous etching of the upper layer of oxide 20 and the prominent part of the layer which protects against oxidation 27 (that which is located on the island 24) is carried out, stopping on the protective layer which forms a mask 27. The structure shown in FIG. 6E is obtained. The layer of oxide 26 is thus revealed.

Figure 6F:
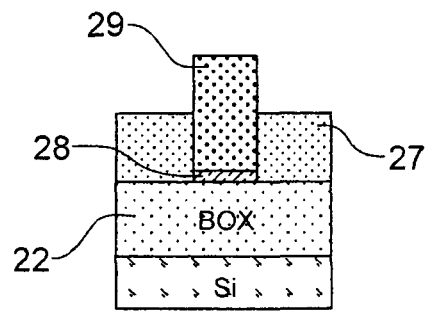

The germanium enrichment is carried out to obtain a layer of SiGe 28 on the buried oxide layer 22, or even a layer of pure Ge. The layer 28 has a silicon oxide layer 29 on top of it. This is shown by FIG. 6F.

Figure 6G:
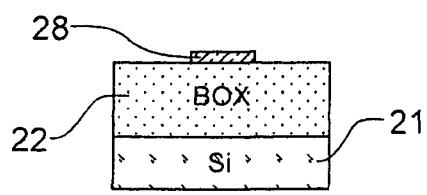

The silicon oxide layer 29 and the mask 27 may then be removed by etching to provide the structure shown in FIG. 6G.

The method described above avoids a chemical-mechanical polishing step of an oxidation mask which stops on the oxide layer on the SiGe layer in the embodiment of FIG. 5A. Indeed, this type of planarisation is technologically critical. By contrast, the chemical-mechanical polishing of an oxide which stops on the mask and the etching of an oxide and a mask at the same speed are steps that are technologically possible.

During the germanium enrichment step, using dry oxidation at high temperature, it is possible to reveal zones called "birds' beaks" in the germanium enriched layer and close to the mask which protects against oxidation. These zones correspond to regions where the oxidation is slower. In these zones, the layers of SiGe are thicker and not as enriched. The oxidation kinetics, which are slower close to the mask which protects against oxidation, could be attributed to a strain effect exerted by the protective mask, an effect which would thus slow down the oxidation. These non homogeneous enrichment zones are to be reduced as far as possible if the density of islands with a germanium enriched layer is to be increased.

To reduce these non homogeneous zones, the germanium condensation (or germanium enrichment) method may be used by repeating oxidation and de-oxidation steps so that the silicon oxide layer formed does not overshoot the thickness of the mask which protects against oxidation. After each oxidation step, it is preferable to deposit on the islands, a silicon oxide layer of a few nanometers in order to preserve the germanium from oxidation when each oxidation step starts. In one embodiment, it was possible to reduce the width of the birds' beaks from 171 nm to 20 nm.

Another possibility to reduce the non homogeneous zones is to deposit the mask which protects against oxidation in a state of tension or compression strain. This permits the strain exerted on the oxidation zones to be modulated and thus to reduce the non-homogeneities of the oxidation kinetics.

Figure 7A:
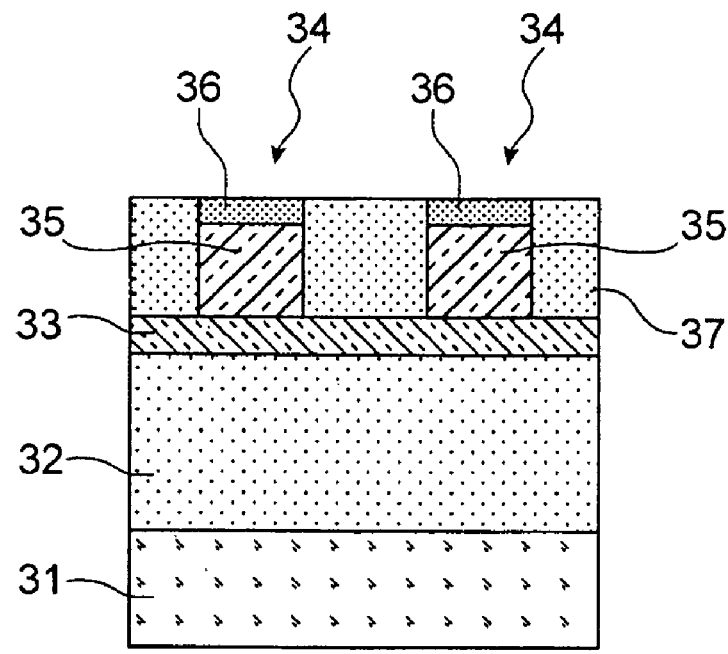
FIGS. 7A and 7B illustrate the principle of the manufacturing method according to the invention, with a mask to protect against the lateral oxidation and oxidation through the buried insulating layer, according to a second variant of embodiment.
Figure 7B:
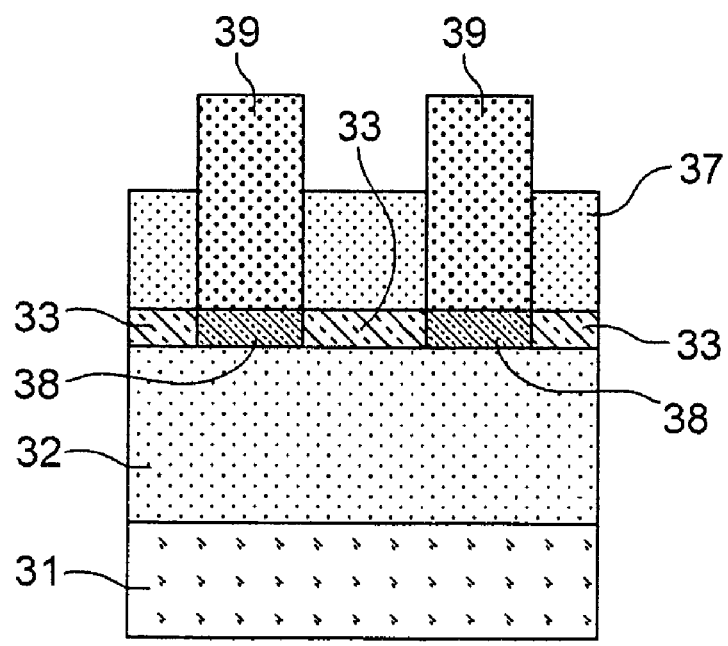

According to a second embodiment of the invention, the method permits a side by side co-integration to be obtained of zones of Silicon-on-Insulator or Silicon/Germanium-on-Insulator. This second variant is illustrated in FIGS. 7A and 7B. The only difference with respect to the first variant is that, during the etching of the islands (or mesas), the layer which stops the etching is formed by the superficial layer of silicon of the SOI substrate instead of the buried insulating layer.

FIG. 7A is to be compared with FIG. 5A. It shows a silicon support 31 supporting a buried oxide layer 32 and a superficial layer of silicon 33. Reference 34 designates the islands which each comprise, superposed, a zone of the superficial layer of silicon, a remaining part 35 after the etching of the SiGe (or $Si_{1-x}Ge_x$) and a remaining part 36 of silicon oxide. Reference 37 designates the mask which protects against oxidation surrounding the islands 34 of which only the silicon oxide layer 36 is at the surface. In this variant, the mask rests on the silicon layer 33.

The germanium enrichment of the localised zones defined by the islands is then carried out, by dry oxidation at high temperature. As shown in FIG. 7B, a transformation of the islands with germanium enrichment in the silicon zones corresponding to these islands is obtained, providing, per island, a layer of SiGe 38 (or even a layer of pure germanium) resting on the buried oxide layer 32. The rest of the islands is formed by silicon oxide 39. By eliminating the silicon oxide 39 and the mask 37, a structure is obtained which comprises SiGe (or Ge) on insulator zones next to Si on insulator zones.

The invention claimed is:

1. Manufacturing method of a semi-conductor on insulator substrate from an SOI substrate comprising a superficial layer of silicon (13, 23, 33) on an electrically insulating layer (12, 22, 32), called a buried insulating layer, wherein a layer of $Si_{1-x}Ge_x$ (15, 25, 35) is formed on the superficial layer of silicon, wherein the method comprises the following steps:
   formation of a silicon oxide layer (16, 26, 36) on the layer of $Si_{1-x}Ge_x$,
   etching of the stack formed by the superficial layer of silicon, the layer of $Si_{1-x}Ge_x$ and the silicon oxide layer, wherein the etching is carried out either up to the buried insulating layer to obtain an etched structure with at least one island (14, 24) of said stack, or up to the superficial layer of silicon (33) to obtain an etched structure with at least one zone of silicon (33) and at least one island (34) of said stack,
   formation of a mask to protect against oxidation (17, 27, 37) on the etched structure, wherein the protective mask only leaves visible the silicon oxide layer (16, 26, 36) of the island,
   condensation of the germanium of the layer of $Si_{1-x}Ge_x$ on the island to obtain an island comprising a layer (18, 28, 38) that is either enriched in or composed of germanium, on the buried insulating layer, with a silicon oxide layer (19, 29, 39) on top of said layer (18, 28, 38) that is enriched in or composed of germanium.

2. Method according to claim 1, wherein the formation of the mask which protects against oxidation comprises:
   the deposition of a layer which protects against oxidation (27) on the etched structure, wherein the layer which protects against oxidation is thicker than the combined thickness of the superficial layer of silicon (23) and the layer of $Si_{1-x}Ge_x$ (27) and thinner than the thickness of the stack,
   the planarisation of the layer which protects against oxidation (27) until the silicon oxide layer (26) of the island (24) is revealed.

3. Method according to claim 2, wherein, after the deposition of the layer which protects against oxidation (27), the deposition of a covering layer (20) on the layer which protects against oxidation, the planarisation step comprises the chemical-mechanical polishing of the covering layer (20) which stops on the part of the layer which protects against oxidation (27) located on the island (24), then the simultaneous etching of the layer which protects against oxidation (27) and the covering layer (20) which stops on the layer which protects against oxidation (27) until said mask is obtained.

4. Method according to claim 3, wherein the covering layer (20) is a silicon oxide layer.

5. Method according to claim 4, wherein the covering layer (20) is a HDP type silicon oxide layer.

6. Method according to any of claims 1 to 5, wherein, following the germanium condensation step, there is a step for eliminating the mask which protects against oxidation (17, 27, 37) and the silicon oxide layer (19, 29, 39) on top of the germanium enriched layer (18, 28, 38).

7. Method according to claim 1, wherein the layer of $Si_{1-x}Ge_x$ (15, 25, 35) is formed by epitaxy.

8. Method according to claim 1, wherein that the silicon oxide layer (16, 26, 36) formed on the layer of $Si_{1-x}Ge_x$ (15, 25, 35) is formed by thermal oxidation at high temperature (HTO oxide).

9. Method according to claim 1, wherein the buried insulating layer of the SOI substrate is a silicon oxide layer.

10. Method according to claim 1, wherein the mask which protects against oxidation (17, 27, 37) is made of silicon nitride.

11. Method according to claim 1, wherein the germanium condensation step comprises a repetition of oxidation and de-oxidation steps.

12. Method according to claim 11, wherein the repetition of oxidation and de-oxidation steps is carried out so that said silicon oxide layer on top of said germanium enriched layer does not overshoot the mask which protects against oxidation.

13. Method according to claim 1, the mask which protects against oxidation is formed in a state of tension or compression strain.

* * * * *